United States Patent [19]

Kumar

[11] Patent Number: 4,549,152

[45] Date of Patent: Oct. 22, 1985

[54] BROADBAND ADJUSTABLE PHASE MODULATION CIRCUIT

[75] Inventor: Mahesh Kumar, Dayton, N.J.

[73] Assignee: RCA Corporation, Princeton, N.J.

[21] Appl. No.: 479,452

[22] Filed: Mar. 28, 1983

[51] Int. Cl.$^4$ .............................................. H03C 3/00
[52] U.S. Cl. .................................. 332/23 R; 333/156;
333/164; 330/124 R; 330/295; 330/277;
330/278; 330/53; 330/286
[58] Field of Search ............... 333/156, 161, 164, 116,
333/109, 117, 118, 100, 120, 124, 125, 136, 112;
330/53, 295, 286, 124 R, 124 D, 4.5, 277, 278,
280; 332/23 R, 16, 17; 343/368, 371, 373, 853;
455/102, 103, 105, 110, 111, 116

[56] References Cited

U.S. PATENT DOCUMENTS

| 3,403,357 | 9/1968 | Rosen et al. | 330/124 R X |
|---|---|---|---|
| 3,423,688 | 1/1969 | Seidel | 333/117 X |
| 3,571,739 | 3/1971 | Seidel | 330/4.5 |
| 3,740,756 | 6/1973 | Sosin | 343/853 |
| 3,988,705 | 10/1976 | Drapac | 333/24 R X |
| 4,061,984 | 12/1977 | Zirwas | 330/124 R X |
| 4,161,705 | 7/1979 | Nemit et al. | 333/156 |
| 4,297,641 | 10/1981 | Sterzer | 328/15 |
| 4,311,965 | 1/1982 | Jones | 330/124 R |
| 4,398,161 | 8/1983 | Lamb et al. | 333/156 |

OTHER PUBLICATIONS

U. S. Patent Application, Serial No. 249,609, "Hybrid Power Divider/Combiner Circuit".

"Broad-Band Active Phase Shifter Using Dual-Gate MESFET" by M. Kumar, et al., reprint from *IEEE Transactions on Microwave Theory and Techniques,* vol. MTT-29, No. 10, Oct. 1981.

*Primary Examiner*—Eugene R. LaRoche
*Assistant Examiner*—Benny Lee
*Attorney, Agent, or Firm*—Joseph S. Tripoli; Robert L. Troike; Raymond E. Smiley

[57] ABSTRACT

A phase modulation circuit to provide at an output terminal an output signal controllably shifted from 0° to 360° relative to an input signal provided at an input terminal includes a first 90° coupler connected between the input terminal and second and third 90° couplers, four gain controllable amplifiers, fourth and fifth 90° couplers and an in phase combiner with its output connected to the output terminal. Two of the amplifiers are connected between the second and fourth couplers. The additional amplifiers are connected between the third and fifth couplers. The fourth and fifth couplers are connected to the inputs of the in-phase combiner. The gain through the various amplifiers is adjusted to control the amount of phase shift through the circuit.

7 Claims, 5 Drawing Figures

TABLE

| CASE | AMPLIFIER | | | | POINT X | | POINT Y | |
|---|---|---|---|---|---|---|---|---|
| | 1 | 2 | 3 | 4 | | | | |
| 1 | ON | OFF | OFF | ON | $A_1 \cdot j\sin\theta \cdot \cos^2\theta \cdot e^{-j3\beta\ell+\phi} \Rightarrow jA_1$ | | $A_4 \cdot \cos^3\theta \cdot e^{-j3\beta\ell+\phi} \Rightarrow A_4$ | $0°–90°$ |
| 2 | OFF | ON | OFF | ON | $-A_2 \cdot j\sin^3\theta \cdot e^{-j3\beta\ell+\phi} \Rightarrow -jA_2$ | | $A_4 \cdot \cos^3\theta \cdot e^{-j3\beta\ell+\phi} \Rightarrow A_4$ | $90°–180°$ |
| 3 | OFF | ON | ON | OFF | $-A_2 \cdot j\sin^3\theta \cdot e^{-j3\beta\ell+\phi} \Rightarrow -jA_2$ | | $-A_3 \cdot \sin^2\theta \cdot \cos\theta \cdot e^{-j3\beta\ell+\phi} \Rightarrow -A_3$ | $180°–270°$ |
| 4 | ON | OFF | ON | OFF | $A_1 \cdot j\sin\theta \cdot \cos^2\theta \cdot e^{-j3\beta\ell+\phi} \Rightarrow jA_1$ | | $-A_3 \cdot \sin^2\theta \cdot \cos\theta \cdot e^{-j3\beta\ell+\phi} \Rightarrow -A_3$ | $270°–360°$ |
| 5 | ON | OFF | OFF | OFF | $A_1 \cdot j\sin\theta \cdot \cos^2\theta \cdot e^{-j3\beta\ell+\phi} \Rightarrow jA_1$ | | 0 | $0°$ |
| 6 | OFF | OFF | OFF | ON | 0 | | $A_4 \cdot \cos^3\theta \cdot e^{-j3\beta\ell+\phi} \Rightarrow A_4$ | $90°$ |
| 7 | OFF | ON | OFF | OFF | $-A_2 \cdot j\sin^3\theta \cdot e^{-j3\beta\ell+\phi} \Rightarrow -jA_2$ | | 0 | $180°$ |
| 8 | OFF | OFF | ON | OFF | 0 | | $-A_3 \cdot \sin^2\theta \cdot \cos\theta \cdot e^{-j3\beta\ell+\phi} \Rightarrow -A_3$ | $270°$ |

Fig.5

BROADBAND ADJUSTABLE PHASE MODULATION CIRCUIT

The United States government has rights in this invention pursuant to Contract Number N00014-79-C-0568 awarded by the Department of the Navy.

BACKGROUND OF THE INVENTION

This invention is concerned with phase modulation circuits and more particularly with such circuits which are adjustable in the amount of phase modulation.

Phase modulation circuits find use as modulators in communications equipment, both ground-based and airborne and other phase modulation circuits may also be used in other applications such as in connection with phased array radars. A prior art phase modulation circuit generally of the type that the instant invention is concerned with is described in an article entitled "Broad-Band Active Phase Shifter Using Dual-Gate MESFET" by M. Kumar, R. J. Menna, and H. Huang, *IEEE Transactions on Microwave-Theory-and Techniques*, Vol. MTT-29, No. 10, October 1981, pp. 1098–1102. The phase shift circuit described in the article uses a 180° hybrid which itself is composed of three 90° couplers and a length of transmission line acting as a delay. The prior art circuit utilizes two additional 90° couplers, three two port in-phase combiners and four dual-gate field effect transistor (FET) amplifiers. This is in contrast to the instant invention which utilizes five 90° couplers (but none used as a 180° hybrid), four amplifiers and one two port in-phase combiner. Because the instant invention does not utilize the 180° hybrid as in the prior art, it has a wider bandwidth than the prior art circuit. Further, because the parts count is smaller, the physical size of the circuit is smaller, a desirable property.

SUMMARY OF THE INVENTION

In accordance with a preferred embodiment of the present invention, a phase modulation circuit connected between an input terminal and an output terminal comprises the combination of first, second, third, fourth and fifth 90° couplers, first, second, third and fourth adjustable gain amplifiers and an in-phase combiner having an output port connected to the circuit output terminal. An input port of the first 90° coupler is connected to the circuit input terminal, the output ports of the first 90° coupler are connected to respective input ports of the second and third 90° couplers. The second and third 90° couplers are connected to respective ones of the four adjustable gain amplifiers. The outputs of the adjustable gain amplifiers are connected to the input ports of the fourth and fifth 90° couplers. An output port of each of the fourth and fifth 90° couplers is connected to a respective input port of the in-phase combiner. By adjusting the gain in the various amplifiers in a preselected manner, a signal at the input terminal can be shifted through anything from 0° to 360° at the output terminal.

BRIEF DESCRIPTION OF THE DRAWINGS

FIG. 5 is a table of mathematical expressions of signals appearing at two points in FIG. 1.

DETAILED DESCRIPTION OF A PREFERRED EMBODIMENT

Figure 1:
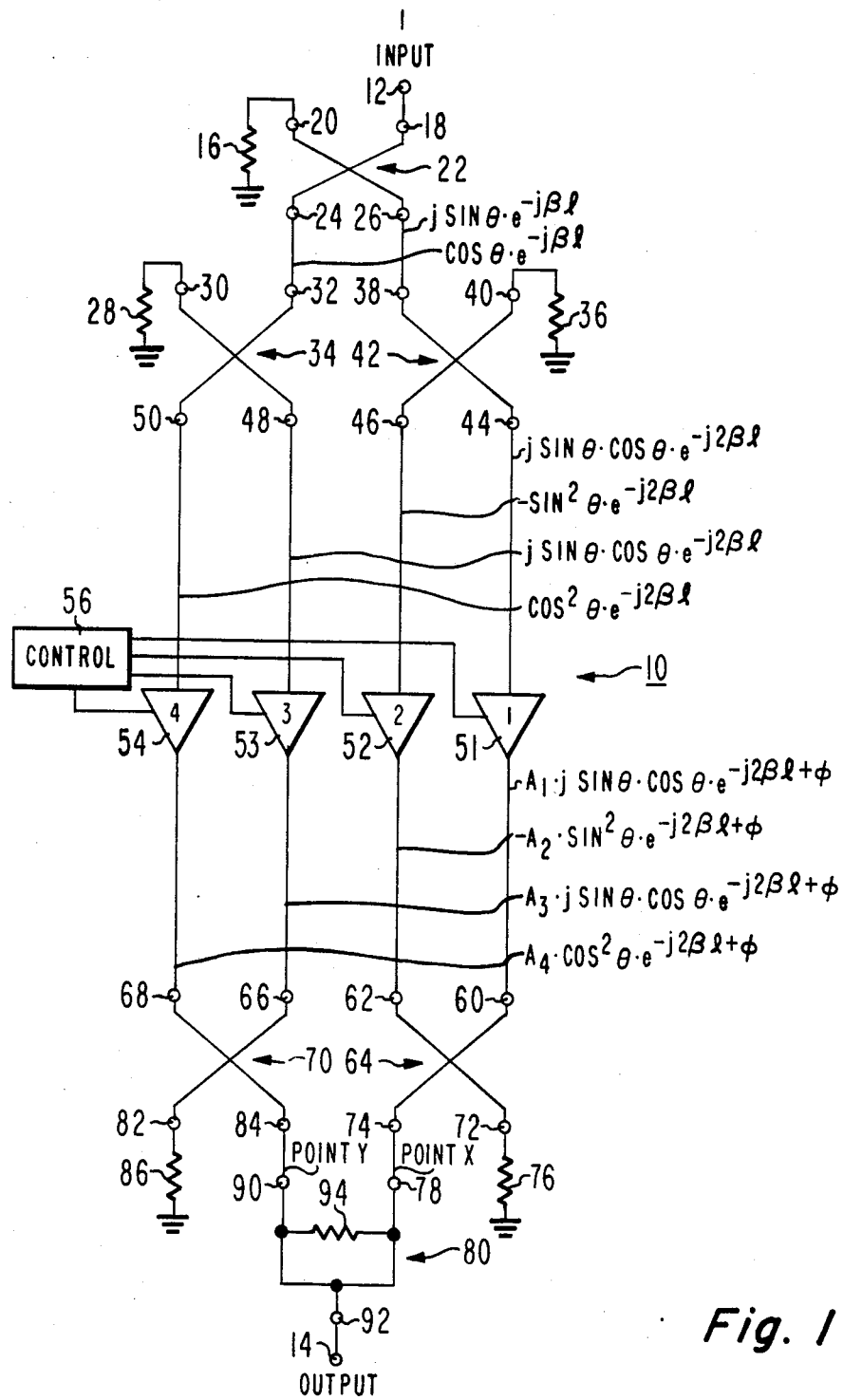
FIG. 1 is an electrical schematic diagram of an adjustable phase modulation circuit in accordance with a preferred embodiment of the present invention.

Referring to FIG. 1, a 360° phase modulation circuit 10 has an input terminal 12 receptive of an alternating signal typically at microwave frequencies and an output terminal 14 at which the signal appears delayed in phase by any amount and typically shifted in the amplitude. Each of input terminal 12 and a terminating impedance 16 is coupled to a respective one of a pair of input ports 18, 20 of a first 90° coupler 22. Coupler 22 typically may be an interdigitated coupler and may typically be a 3dB coupler, though the method of construction and power division are not critical. An interdigitated 3dB coupler of the type utilized as coupler 22 is illustrated and described in U.S. patent application, Ser. No. 249,609 filed Mar. 31, 1981, now U.S. Pat. No. 4,394,629 issued July 19, 1983 and incorporated herein by reference. The mathematical expression near the output ports 24, 26 of coupler 22 (and at other points in FIG. 1) mathematically describe the signal at these points given a unity value signal at input terminal 12 and ignoring conductor and dielectric losses in passing through coupler 22 and other components to be described. Thus the signal at port 24 is $\cos \theta \cdot e^{-j\beta l}$ where $\theta$ is the coupling angle (45° for a 3 dB coupler), · is the multiplication symbol, $j$ is the imaginary number, $\beta$ is the propagation constant through the coupler, and $l$ is the coupling length.

Port 24 and a terminating impedance 28 are coupled to respective ones of a pair of input ports 32, 30 of a second 90° coupler 34 while port 26 and a terminating impedance 36 are coupled to respective ones of a pair of input ports 38, 40 of a third 90° coupler 42. Couplers 34 and 42 are typically identical to coupler 22 in construction. It will be realized that the lengths of the transmission lines between ports 24 and 32 and between ports 26 and 38 may in practice not exist, but are illustrated in FIG. 1 to facilitate the placement of mathematical expressions in the FIGURE.

The pair of output terminals 44, 46 of coupler 42 are connected respectively to first and second dual-gate MESFET amplifiers 51 and 52 also legended 1 and 2 to facilitate a description of operation which follows hereinafter. Similarly, the pair of output ports 48, 50 of coupler 34 are connected respectively to third and fourth dual gate MESFET amplifiers 53 and 54 also legended 3 and 4. Amplifiers 51–54 may typically be of the type described in an article entitled "Dual-Gate MESFET Variable-Gain Constant-Output Power Amplifier" by M. Kumar and H. Huang, *IEEE Transactions on Microwave Theory and Techniques*, Vol. MTT-29, No. 3, March 1981, pp. 185–189 and as illustrated in FIG. 2 to which attention is now directed.

Figure 2:
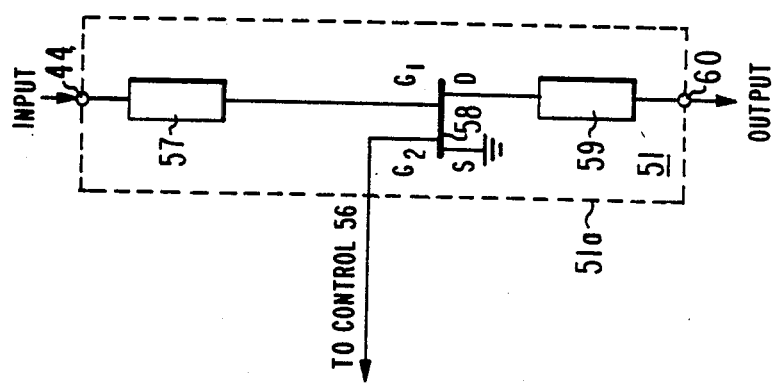
FIG. 2 is an electrical schematic diagram of an amplifier useful in the circuit of FIG. 1.

With reference to FIG. 2, amplifier 51 within dashed block 51a and other amplifiers 52–54 comprise an input impedance matching network 57, coupled between port 44 (see FIG. 1) and gate $G_1$ of the actual dual gate MESFET 58. An output matching impedance 59 is coupled between the drain (D) of MESFET 58 and port 60 (see FIG. 1). The source (S) of MESFET 58 is system grounded while gate $G_2$ is coupled to a control circuit 56. Not shown in FIG. 2 is standard bias circuitry. The input matching network 57 has a 50 ohm input characteristic impedance and an output characteristic impedance of a few ohms, ten being exemplary, to match the gate impedance (G1) of transistor 58. Output matching network 59 has a characteristic input impedance of a few ohms, ten being exemplary, to match the drain (D) output impedance of transistor 58 and a characteristic output impedance to match that of circuits to which it is connected. Typically that output impedance is 50 ohms, although, as will be discussed in connection with FIG. 4, it may be different such as 25 ohms.

The outputs of amplifiers 51 and 52 are connected to respective ones of a pair of input ports 60, 62 of a fourth 90° coupler 64 while the outputs of amplifiers 53 and 54 are connected to respective ones of a pair of input ports 66, 68 of a fifth 90° coupler 70. Couplers 64 and 70 may typically be identical to coupler 22. The output ports 72 and 74 of coupler 64 are connected respectively to a terminating impedance 76 and an input port 78 of an in-phase combiner 80. Similarly output ports 82 and 84 of coupler 70 are connected respectively to a terminating impedance 86 and an input port 90 of combiner 80. The output port 92 of combiner 80 is connected to output terminal 14 while an isolation impedance 94 is connected across the input legs of combiner 80. The mathematical expression of points X and Y is dependent on the status of the various amplifiers 51–54 and as illustrated in the TABLE included as part of the drawings which will be described hereinafter.

The actual phase shift of the signal at output terminal 14 relative to the input at input terminal 12 is a function of the gain of each of amplifiers 51–54 as determined by control circuit 56. Circuit 56 provides four independently adjustable voltages which, by way of example, can vary from 0 volts to −4 volts. The adjustment can be controlled by any suitable means such as by a programmed microcomputer. The variation of control voltage from 0–4 volts, varies the gain of the amplifier, by way of example, from approximately +10 dB to −40 dB. The mathematical expressions at the outputs of couplers 64 and 70 as illustrated in the FIG. 5 TABLE should be referred to.

Referring to FIG. 1 and to Case 1 in the TABLE, assuming a unity input signal at input terminal 12, assuming all 3 dB couplers 22, 34, 42, 64 and 70, assuming $\theta$ is 45° and assuming that under control of control circuit 56 amplifiers 2 and 3 are completely cut off, the signal at point X is $A_1 \cdot j \sin \theta \cdot \cos^2 \theta \cdot e^{-j\beta l + \phi}$ where $\phi$ is the phase delay through the amplifier and $j, \theta, \beta$ and $l$ are as previously identified. Similarly, the signal at point Y is $A_4 \cdot \cos^3 \theta \cdot e^{-j\beta l + \phi}$. For the assumed case of 3 dB couplers, the expressions $\sin \theta \cdot \cos^2 \theta$ and $\cos^3 \theta$ are identical in value and constant. The expression $e^{-j\beta l + \phi}$ appearing identically at both points X and Y is a frequency dependent expression. However, since the expressions are identical they track as frequency changes. Therefore, the circuit 10 is considered broad band. Ignoring the common valued expressions of the point X and point Y signal equations, the point X equation reduces to $jA_1$, where j is the imaginary number. That is, the signal at point X is simply a function of the gain of amplifier 1. The gain of amplifier 1 is determined by control circuit 56. Similarly the equation at point Y, ignoring common valued expressions, is $A_4$ or simply a function of the gain of amplifier 4. The signals $A_4$ and $jA_1$ are combined by in-phase combiner 80 to produce a signal at terminal 14 between 0° and 90° (see FIG. 3) depending on the relative values of $A_1$ and $A_4$. The angles 0° and 90° are relative to some arbitrary reference. That is, 0° is not 0° relative to the input signal at terminal 12. Nevertheless, the outputs at points X and Y as determined by the gain in the various amplifiers 51–54 are related to one another, as illustrated in FIG. 3.

Figure 3:
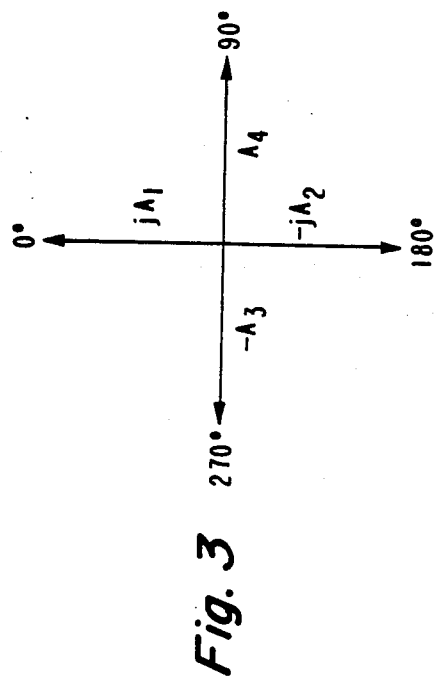
FIG. 3 is a vector diagram useful in understanding the operation of the phase modulation circuit of FIG. 1.

The actual phase angle of the output relative to 0° of FIG. 3 is a function of the magnitudes of $A_1$ and $A_4$. If $A_1 = A_4$ the phase of the output signal is 45°. If $A_1 > A_4$, the angle lies between 0° and 45°. If $A_4 > A_1$, the angle lies between 45° and 90°. If $A_4 = 0$ and $A_1$ is anything more than 0 (Case 5) the phase angle is 0°. Other phase angles can be achieved by turning on and off various ones of the amplifiers as illustrated in the TABLE.

It will be realized that the circuit of FIG. 1 is applicable to amplitude modulation in addition to, or in place of, the phase modulation above described. Thus relative to Case 1 if $A_1$ equals 1 unit and $A_2$ equals 1 unit a 45° phase shift is accomplished with an output at terminal 14 of 1.414 units. Now, if both $A_1$ and $A_4$ increase to two units, the same 45° phase shift is maintained, but the output at terminal 14 is 2.828 units. If $A_1$ is at 2 units and $A_4$ is 1 unit, the output at terminal 14 is 2.236 units with a phase angle of 63.43°. Thus both the amplitude and phase have changed.

It can be shown that by proper choice of input signals to the four control gates, the following modulation functions may be performed by circuit 10: (a) amplitude modulation; (b) pulse code modulation; (c) frequency modulation; (d) phase modulation; (e) continuous phase modulation; (f) biphase shift keying; (g) quadraphase shift keying; (h) multiphase shift keying; (i) single-side band modulation; (j) quadrature amplitude modulation; and (k) combination of above.

Figure 4:
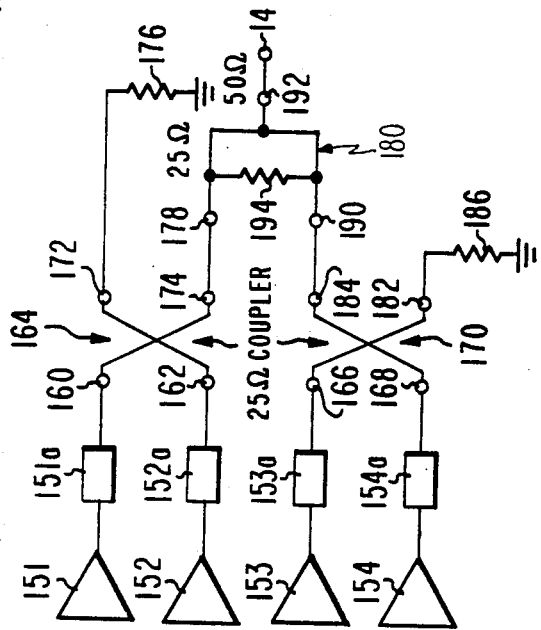
FIG. 4 is an electrical schematic diagram of a portion of an alternative phase modulation circuit of FIG. 1.

An alternative phase modulation circuit is illustrated in FIG. 4 to which attention is now directed. The operation of the FIG. 4 circuit is identical to that of FIG. 1 and its construction from input terminal 12 to the amplifiers is identical to that of FIG. 1 and therefore not illustrated in FIG. 4. A typical MESFET of the type utilized in the amplifiers of FIG. 1 or FIG. 4 exhibits approximately 10 ohms output impedance, yet typically 90° couplers such as 64 and 70 in FIG. 1 are designed to operate with 50 ohms input and output impedance. Therefore, the typical matching network between the FET and 90° coupler has to match 10 ohms to 50 ohms.

In FIG. 4, the output matching networks 151a–154a are illustrated separately from the remainder of their associated respective amplifying devices and input impedance matching networks 151–154, unlike the conventional way of illustrating such amplifiers which are assumed to include the output matching networks as exemplified in FIG. 1. With reference to FIGS. 2 and 4, block 151, FIG. 4, for example, is equivalent to the combination of input matching network 57 and the amplifying device 58 including the drain (D) output thereof in FIG. 2 and block 151a, FIG. 4, is equivalent to output matching network 59, FIG. 2. Blocks 151–154 will hereinafter be referred to as amplifying devices 151–154 although it will be understood that the blocks also comprise input impedance matching networks. Thus, an amplifier in FIG. 4 comprises an amplifying device such as 151 and an associated output impedance matching network such a as 151a. In FIG. 4, 90° couplers 164 and 170 are identical to 64 and 70 respectively in FIG. 1, except that couplers 164 and 170 exhibit 25 ohm input impedances, not 50 ohm impedances at the input ports 160, 162, 166 and 168 and 25 ohm output impedances at the output ports 172, 174, 182 and 184. Such couplers are described in an article entitled "Monolithic GaAs Interdigitated Couplers", by M. Kumar, et al., *IEEE Transactions on Electron Devices,* Vol. ED-30, No. 1, pp. 29–32, January 1983. Therefore, the matching networks are designed to match the approximately 10 ohm output impedance of the amplifying device drains of amplifying devices 151-154 to the 25 ohm impedance of couplers 164 and 170. Also in FIG. 4, in-phase combiner 180 is identical to in-phase combiner 80 of FIG. 1 except that it exhibits a 25 ohm impedance, not 50 ohms, at input ports 178 and 190 and a conventional 50 ohm impedance at output port 192. Such an in-phase combiner is described in an article entitled "Split-Tee Power Divider", by L. I. Parad and R. L. Moynihan, *IEEE Transactions on Microwave Theory and Techniques,* Vol. MTT-13, pp. 91–95, January 1965. By using 25 ohm couplers several advantages are realized. First, the number of matching elements in networks 151a-154a is reduced relative to the number used in conventional matching networks resulting in a physically smaller phase shift circuit. A 25 ohm coupler has a lower signal loss than does a 50 ohm coupler. Because of the lower loss in the matching network and smaller ratio of the impedance transformation, the bandwidth of the circuit is improved relative to a circuit utilizing only 50 ohm components. If 10 ohm 90° couplers 164-170 could be realistically fabricated, the component sizes in matching networks 151a-154a and thus the overall phase shift circuit, could be even smaller. Although known techniques do not realistically allow for such reduced impedance couplers, these lower impedance couplers should be possible to be manufactured in the future.

What is claimed is:

1. A phase modulation circuit connected between an input terminal and output terminal comprising in combination:

first, second, third, fourth and fifth 90° couplers each having a pair of input ports and a pair of output ports;

first, second, third and fourth adjustable gain amplifiers each having a control terminal, an input port and an output port;

an in-phase combiner having an output port coupled to said output terminal and a pair of input ports;

the input ports of said first 90° coupler being connected to said input terminal and a terminating impedance respectively, one of the pair of output ports thereof and a terminating impedance being connected respectively to the respective input ports of said second 90° coupler, the other of the pair of output ports of said first 90° coupler and a terminating impedance being connected respectively to the respective input ports of said third 90° coupler, the output ports of said second 90° coupler being connected to the input ports of said first and second amplifiers respectively, the output ports of said third 90° coupler being connected to the input ports of said third and fourth amplifiers respectively, the output ports of said first and second amplifiers being connected respectively to the input ports of said fourth 90° coupler, the output ports of said third and fourth amplifiers being connected respectively to the input ports of said fifth 90° coupler, one of the pair of output ports of each of said fourth and fifth 90° couplers being connected to said input ports of said in-phase combiner, the other of the pair of output ports of said fourth and fifth 90° couplers being connected respectively to respective terminating impedances; and a control means coupled to the control terminal of each amplifier for controlling the gain thereof and for thereby controlling the phase shift of signal between said input terminal and said output terminal.

2. The combination as set forth in claim 1 wherein said first, second, third and fourth amplifiers comprise dual gate FET's.

3. The combination as set forth in claim 1 wherein each of said 90° couplers is an interdigitated coupler.

4. The combination as set forth in claim 2 wherein each of said 90° couplers is an interdigitated coupler.

5. The combination as set forth in claim 1 wherein said control means enables, as a function of time, various combinations of no more than two of said first, second, third and fourth amplifiers at a time.

6. The combination as set forth in claim 1 wherein the value of output impedance of said first, second, third and fourth amplifiers is different than the value of input impedance thereof and wherein the impedance of said fourth and fifth 90° couplers matches the output impedance of said first, second, third and fourth amplifiers.

7. The combination as set forth in claim 6 wherein the value of input impedance of said in-phase combiner is the same as the value of output impedance of said first, second, third and fourth amplifiers and the value of output impedance of said in-phase combiner is the same as the value of input impedance of said first, second, third and fourth amplifiers.

* * * * *